(12) United States Patent
Khlat

(10) Patent No.: US 11,228,233 B2
(45) Date of Patent: Jan. 18, 2022

(54) DUAL-MODULATION POWER MANAGEMENT CIRCUIT

(71) Applicant: Qorvo US, Inc., Greensboro, NC (US)

(72) Inventor: Nadim Khlat, Cugnaux (FR)

(73) Assignee: Qorvo US, Inc., Greensboro, NC (US)

( * ) Notice: Subject to any disclaimer, the term of this patent is extended or adjusted under 35 U.S.C. 154(b) by 46 days.

(21) Appl. No.: 16/582,471

(22) Filed: Sep. 25, 2019

(65) Prior Publication Data

US 2020/0321848 A1    Oct. 8, 2020

Related U.S. Application Data

(60) Provisional application No. 62/828,214, filed on Apr. 2, 2019.

(51) Int. Cl.
*H02M 1/00* (2006.01)
*H02M 3/07* (2006.01)
(Continued)

(52) U.S. Cl.
CPC ............... *H02M 1/00* (2013.01); *G05F 1/46* (2013.01); *H02M 3/07* (2013.01); *H03F 1/0288* (2013.01); *H03F 3/245* (2013.01); *H02M 1/0045* (2021.05); *H03F 2200/105* (2013.01); *H03F 2200/451* (2013.01); *H04W 88/02* (2013.01)

(58) Field of Classification Search
CPC ........ H02M 1/00; H02M 3/07; H02M 1/0045; G05F 1/46; H03F 1/0288; H03F 3/245; H03F 2200/105; H03F 2200/451; H03F 2200/429; H03F 3/191; H03F 3/195;
(Continued)

(56) References Cited

U.S. PATENT DOCUMENTS 5,510,753 A    4/1996 French
5,838,732 A    11/1998 Carney
(Continued)

FOREIGN PATENT DOCUMENTS

EP    3174199 A2    5/2017

OTHER PUBLICATIONS

Non-Final Office Action for U.S. Appl. No. 16/122,611, dated Mar. 11, 2020, 16 pages.
(Continued)

*Primary Examiner* — Adolf D Berhane
(74) *Attorney, Agent, or Firm* — Withrow & Terranova, PLLC

(57) ABSTRACT

The present disclosure relates to a dual-modulation power management circuit (PMC), which includes a first tracking amplifier coupled to a first voltage port and configured to contribute to a first modulated voltage at the first voltage port, a second tracking amplifier coupled to a second voltage port and configured to contribute to a second modulated voltage at the second voltage port, a charge pump, a power inductor, and a low-dropout (LDO) switch unit. Herein, the power inductor is configured to induce an output current, which is based on a boosted voltage generated by the charge pump, toward the first voltage port. A first portion of the output current is eligible to flow through the LDO switch unit from the first voltage port to the second voltage port. The first modulated voltage is not smaller than the second modulated voltage over time.

22 Claims, 4 Drawing Sheets

(51) Int. Cl.
*G05F 1/46* (2006.01)
*H03F 1/02* (2006.01)
*H03F 3/24* (2006.01)
*H04W 88/02* (2009.01)

(58) Field of Classification Search
CPC .... H03F 1/0222; H03F 1/0238; H03F 1/3241; H03F 2200/432; H04W 88/02
See application file for complete search history.

(56) References Cited

U.S. PATENT DOCUMENTS

| | | | |
|---|---|---|---|
| 6,107,862 A | 8/2000 | Mukainakano et al. | |
| 6,141,377 A | 10/2000 | Sharper et al. | |
| 6,141,541 A | 10/2000 | Midya et al. | |
| 6,985,033 B1 | 1/2006 | Shirali et al. | |
| 7,043,213 B2 | 5/2006 | Robinson et al. | |
| 7,471,155 B1 | 12/2008 | Levesque | |
| 7,570,931 B2 | 8/2009 | McCallister et al. | |
| 7,994,862 B1 | 8/2011 | Pukhovski | |
| 8,461,928 B2 | 6/2013 | Yahav et al. | |
| 8,493,141 B2 | 7/2013 | Khlat et al. | |
| 8,519,788 B2 | 8/2013 | Khlat | |
| 8,588,713 B2 | 11/2013 | Khlat | |
| 8,718,188 B2 | 5/2014 | Balteanu et al. | |
| 8,725,218 B2 | 5/2014 | Brown et al. | |
| 8,774,065 B2 | 7/2014 | Khlat et al. | |
| 8,803,603 B2 | 8/2014 | Wimpenny | |
| 8,818,305 B1 | 8/2014 | Schwent et al. | |
| 8,854,129 B2 | 10/2014 | Wilson | |
| 8,879,665 B2 | 11/2014 | Xia et al. | |
| 8,913,690 B2 | 12/2014 | Onishi | |
| 8,989,682 B2 | 3/2015 | Ripley et al. | |
| 9,018,921 B2 | 4/2015 | Gurlahosur | |
| 9,020,451 B2 | 4/2015 | Khlat | |
| 9,041,364 B2 | 5/2015 | Khlat | |
| 9,041,365 B2 | 5/2015 | Kay et al. | |
| 9,055,529 B2 | 6/2015 | Shih | |
| 9,065,509 B1 | 6/2015 | Yan et al. | |
| 9,069,365 B2 | 6/2015 | Brown et al. | |
| 9,098,099 B2 | 8/2015 | Park et al. | |
| 9,166,538 B2 * | 10/2015 | Hong | H03F 3/195 |
| 9,166,830 B2 | 10/2015 | Camuffo et al. | |
| 9,167,514 B2 | 10/2015 | Dakshinamurthy et al. | |
| 9,197,182 B2 | 11/2015 | Baxter et al. | |
| 9,225,362 B2 | 12/2015 | Drogi et al. | |
| 9,247,496 B2 | 1/2016 | Khlat | |
| 9,263,997 B2 | 2/2016 | Vinayak | |
| 9,270,230 B2 | 2/2016 | Henshaw et al. | |
| 9,270,239 B2 | 2/2016 | Drogi et al. | |
| 9,271,236 B2 | 2/2016 | Drogi | |
| 9,280,163 B2 | 3/2016 | Kay et al. | |
| 9,288,098 B2 | 3/2016 | Yan et al. | |
| 9,298,198 B2 | 3/2016 | Kay et al. | |
| 9,344,304 B1 | 5/2016 | Cohen | |
| 9,356,512 B2 | 5/2016 | Chowdhury et al. | |
| 9,377,797 B2 | 6/2016 | Kay et al. | |
| 9,379,667 B2 | 6/2016 | Khlat et al. | |
| 9,445,371 B2 | 9/2016 | Khesbak et al. | |
| 9,515,622 B2 | 12/2016 | Nentwig et al. | |
| 9,520,907 B2 | 12/2016 | Peng et al. | |
| 9,584,071 B2 | 2/2017 | Khlat | |
| 9,595,869 B2 | 3/2017 | Lerdworatawee | |
| 9,595,981 B2 | 3/2017 | Khlat | |
| 9,596,110 B2 | 3/2017 | Jiang et al. | |
| 9,614,477 B1 | 4/2017 | Rozenblit et al. | |
| 9,634,666 B2 | 4/2017 | Krug | |
| 9,748,845 B1 | 8/2017 | Kotikalapoodi | |
| 9,806,676 B2 | 10/2017 | Balteanu et al. | |
| 9,831,834 B2 | 11/2017 | Balteanu et al. | |
| 9,837,962 B2 | 12/2017 | Mathe et al. | |
| 9,923,520 B1 | 3/2018 | Abdelfattah et al. | |
| 10,003,416 B1 | 6/2018 | Lloyd | |
| 10,090,808 B1 | 10/2018 | Henzler et al. | |
| 10,097,145 B1 | 10/2018 | Khlat et al. | |
| 10,103,693 B2 | 10/2018 | Zhu et al. | |
| 10,110,169 B2 | 10/2018 | Khesbak et al. | |
| 10,158,329 B1 | 12/2018 | Khlat | |
| 10,158,330 B1 | 12/2018 | Khlat | |
| 10,170,989 B2 | 1/2019 | Balteanu et al. | |
| 10,291,181 B2 | 5/2019 | Kim et al. | |
| 10,326,408 B2 | 6/2019 | Khlat et al. | |
| 10,382,071 B2 | 8/2019 | Rozek et al. | |
| 10,476,437 B2 | 11/2019 | Nag et al. | |
| 10,862,431 B1 * | 12/2020 | Khlat | H03F 1/0227 |
| 10,879,804 B2 | 12/2020 | Kim et al. | |
| 11,121,684 B2 | 9/2021 | Henzler et al. | |
| 11,128,261 B2 | 9/2021 | Ranta et al. | |
| 2002/0167827 A1 | 11/2002 | Umeda et al. | |
| 2004/0266366 A1 | 12/2004 | Robinson et al. | |
| 2005/0090209 A1 | 4/2005 | Behzad | |
| 2005/0227646 A1 | 10/2005 | Yamazaki et al. | |
| 2005/0232385 A1 | 10/2005 | Yoshikawa et al. | |
| 2006/0028271 A1 | 2/2006 | Wilson | |
| 2006/0240786 A1 | 10/2006 | Liu | |
| 2007/0052474 A1 | 3/2007 | Saito | |
| 2007/0258602 A1 | 11/2007 | Vepsalainen et al. | |
| 2009/0016085 A1 | 1/2009 | Rader et al. | |
| 2009/0045872 A1 | 2/2009 | Kenington | |
| 2009/0191826 A1 | 7/2009 | Takinami et al. | |
| 2010/0308919 A1 | 12/2010 | Adamski et al. | |
| 2011/0074373 A1 | 3/2011 | Lin | |
| 2011/0136452 A1 | 6/2011 | Pratt et al. | |
| 2011/0175681 A1 | 7/2011 | Inamori et al. | |
| 2011/0279179 A1 | 11/2011 | Vice | |
| 2012/0194274 A1 | 8/2012 | Fowers et al. | |
| 2012/0200435 A1 | 8/2012 | Ngo et al. | |
| 2012/0299645 A1 | 11/2012 | Southcombe et al. | |
| 2012/0299647 A1 | 11/2012 | Honjo et al. | |
| 2013/0021827 A1 | 1/2013 | Ye | |
| 2013/0100991 A1 | 4/2013 | Woo | |
| 2013/0130724 A1 | 5/2013 | Kumar Reddy et al. | |
| 2013/0162233 A1 | 6/2013 | Marty | |
| 2013/0187711 A1 | 7/2013 | Goedken et al. | |
| 2013/0200865 A1 | 8/2013 | Wimpenny | |
| 2013/0271221 A1 | 10/2013 | Levesque et al. | |
| 2014/0009226 A1 | 1/2014 | Severson | |
| 2014/0028370 A1 | 1/2014 | Wimpenny | |
| 2014/0028390 A1 | 1/2014 | Davis | |
| 2014/0057684 A1 | 2/2014 | Khlat | |
| 2014/0103995 A1 | 4/2014 | Langer | |
| 2014/0155002 A1 | 6/2014 | Dakshinamurthy et al. | |
| 2014/0184335 A1 | 7/2014 | Nobbe et al. | |
| 2014/0199949 A1 | 7/2014 | Nagode et al. | |
| 2014/0210550 A1 | 7/2014 | Mathe et al. | |
| 2014/0218109 A1 | 8/2014 | Wimpenny | |
| 2014/0235185 A1 | 8/2014 | Drogi | |
| 2014/0266423 A1 | 9/2014 | Drogi et al. | |
| 2014/0266428 A1 | 9/2014 | Chiron et al. | |
| 2014/0315504 A1 | 10/2014 | Sakai et al. | |
| 2014/0361830 A1 | 12/2014 | Mathe et al. | |
| 2014/0361837 A1 | 12/2014 | Strange et al. | |
| 2015/0048883 A1 | 2/2015 | Vinayak | |
| 2015/0071382 A1 | 3/2015 | Wu et al. | |
| 2015/0098523 A1 | 4/2015 | Lim et al. | |
| 2015/0139358 A1 | 5/2015 | Asuri et al. | |
| 2015/0155836 A1 | 6/2015 | Midya et al. | |
| 2015/0188432 A1 | 7/2015 | Vannorsdel et al. | |
| 2015/0236652 A1 | 8/2015 | Yang et al. | |
| 2015/0236654 A1 | 8/2015 | Jiang et al. | |
| 2015/0236729 A1 | 8/2015 | Peng et al. | |
| 2015/0280652 A1 | 10/2015 | Cohen | |
| 2015/0333781 A1 | 11/2015 | Alon et al. | |
| 2016/0050629 A1 | 2/2016 | Khesbak et al. | |
| 2016/0065137 A1 | 3/2016 | Khlat | |
| 2016/0099687 A1 | 4/2016 | Khlat | |
| 2016/0105151 A1 | 4/2016 | Langer | |
| 2016/0118941 A1 | 4/2016 | Wang | |
| 2016/0126900 A1 | 5/2016 | Shute | |
| 2016/0173031 A1 | 6/2016 | Langer | |
| 2016/0181995 A1 | 6/2016 | Nentwig et al. | |
| 2016/0187627 A1 | 6/2016 | Abe | |
| 2016/0197627 A1 | 7/2016 | Qin et al. | |
| 2016/0226448 A1 | 8/2016 | Wimpenny | |

(56) References Cited

U.S. PATENT DOCUMENTS

| | | |
|---|---|---|
| 2016/0294587 A1 | 10/2016 | Jiang et al. |
| 2017/0012675 A1 | 1/2017 | Frederick |
| 2017/0141736 A1 | 5/2017 | Pratt et al. |
| 2017/0302183 A1 | 10/2017 | Young |
| 2017/0317913 A1 | 11/2017 | Kim et al. |
| 2017/0338773 A1 | 11/2017 | Balteanu et al. |
| 2018/0013465 A1 | 1/2018 | Chiron et al. |
| 2018/0048265 A1 | 2/2018 | Nentwig |
| 2018/0048276 A1 | 2/2018 | Khlat et al. |
| 2018/0076772 A1 | 3/2018 | Khesbak et al. |
| 2018/0123453 A1 | 5/2018 | Puggelli et al. |
| 2018/0288697 A1 | 10/2018 | Camuffo et al. |
| 2018/0302042 A1 | 10/2018 | Zhang et al. |
| 2018/0309414 A1 | 10/2018 | Khlat et al. |
| 2018/0367101 A1 | 12/2018 | Chen et al. |
| 2018/0375476 A1 | 12/2018 | Balteanu et al. |
| 2019/0028060 A1 | 1/2019 | Jo et al. |
| 2019/0044480 A1 | 2/2019 | Khlat |
| 2019/0068234 A1 | 2/2019 | Khlat et al. |
| 2019/0097277 A1 | 3/2019 | Fukae |
| 2019/0109566 A1 | 4/2019 | Folkmann et al. |
| 2019/0109613 A1 | 4/2019 | Khlat et al. |
| 2019/0222175 A1 | 7/2019 | Khlat et al. |
| 2019/0222178 A1 | 7/2019 | Khlat et al. |
| 2019/0253023 A1 | 8/2019 | Yang et al. |
| 2019/0267956 A1 | 8/2019 | Granger-Jones et al. |
| 2020/0007090 A1 | 1/2020 | Khlat et al. |
| 2020/0036337 A1 | 1/2020 | Khlat |
| 2020/0136561 A1 | 4/2020 | Khlat et al. |
| 2020/0136575 A1 | 4/2020 | Khlat et al. |
| 2020/0153394 A1 | 5/2020 | Khlat et al. |
| 2020/0177131 A1 | 6/2020 | Khlat |
| 2020/0204116 A1 | 6/2020 | Khlat |
| 2020/0228063 A1 | 7/2020 | Khlat |
| 2020/0259456 A1 | 8/2020 | Khlat |
| 2020/0259685 A1 | 8/2020 | Khlat |
| 2020/0266766 A1 | 8/2020 | Khlat et al. |
| 2021/0159590 A1 | 5/2021 | Na et al. |
| 2021/0194515 A1 | 6/2021 | Go et al. |

OTHER PUBLICATIONS

Corrected Notice of Allowability for U.S. Appl. No. 15/888,300, dated Feb. 25, 2020, 7 pages.
Notice of Allowance for U.S. Appl. No. 16/018,426, dated Mar. 31, 2020, 7 pages.
Non-Final Office Action for U.S. Appl. No. 16/174,535, dated Feb. 4, 2020, 7 pages.
Quayle Action for U.S. Appl. No. 16/354,234, dated Mar. 6, 2020, 8 pages.
Final Office Action for U.S. Appl. No. 16/122,611, dated Sep. 18, 2020, 17 pages.
Final Office Action for U.S. Appl. No. 16/174,535, dated Jul. 1, 2020, 7 pages.
Advisory Action for U.S. Appl. No. 16/174,535, dated Sep. 24, 2020, 3 pages.
Notice of Allowance for U.S. Appl. No. 16/246,859, dated Sep. 18, 2020, 8 pages.
Non-Final Office Action for U.S. Appl. No. 16/284,023, dated Jun. 24, 2020, 7 pages.
Quayle Action for U.S. Appl. No. 16/421,905, dated Aug. 25, 2020, 5 pages.
Non-Final Office Action for U.S. Appl. No. 16/435,940, dated Jul. 23, 2020, 6 pages.
Non-Final Office Action for U.S. Appl. No. 16/774,060, dated Aug. 17, 2020, 6 pages.
Final Office Action for U.S. Appl. No. 16/284,023, dated Nov. 3, 2020, 7 pages.
Non-Final Office Action for U.S. Appl. No. 16/514,051, dated Nov. 13, 2020, 9 pages.
Notice of Allowance for U.S. Appl. No. 16/174,535, dated Oct. 29, 2020, 7 pages.
Non-Final Office Action for U.S. Appl. No. 16/416,812, dated Oct. 16, 2020, 8 pages.
Non-Final Office Action for U.S. Appl. No. 14/836,634, dated May 16, 2016, 9 pages.
Non-Final Office Action for U.S. Appl. No. 14/868,890, dated Jul. 14, 2016, 13 pages.
Non-Final Office Action for U.S. Appl. No. 15/792,909, dated May 18, 2018, 13 pages.
Notice of Allowance for U.S. Appl. No. 15/459,449, dated Mar. 28, 2018, 7 pages.
Notice of Allowance for U.S. Appl. No. 15/723,460, dated Jul. 24, 2018, 8 pages.
Notice of Allowance for U.S. Appl. No. 15/704,131, dated Jul. 17, 2018, 7 pages.
Notice of Allowance for U.S. Appl. No. 15/728,202, dated Aug. 2, 2018, 7 pages.
Non-Final Office Action for U.S. Appl. No. 15/888,300, dated Aug. 28, 2018, 11 pages.
Notice of Allowance for U.S. Appl. No. 15/792,909, dated Dec. 19, 2018, 11 pages.
Notice of Allowance for U.S. Appl. No. 15/993,705, dated Oct. 31, 2018, 7 pages.
Pfister, Henry, "Discrete-Time Signal Processing," Lecture Note, pfister.ee.duke.edu/courses/ece485/dtsp.pdf, Mar. 3, 2017, 22 pages.
Non-Final Office Action for U.S. Appl. No. 15/888,260, dated May 2, 2019, 14 pages.
Non-Final Office Action for U.S. Appl. No. 15/986,948, dated Mar. 28, 2019, 8 pages.
Non-Final Office Action for U.S. Appl. No. 16/018,426, dated Apr. 11, 2019, 11 pages.
Supplemental Notice of Allowability for U.S. Appl. No. 15/902,244, dated Mar. 20, 2019, 6 pages.
Notice of Allowance for U.S. Appl. No. 15/902,244, dated Feb. 8, 2019, 8 pages.
Advisory Action for U.S. Appl. No. 15/888,300, dated Jun. 5, 2019, 3 pages.
Notice of Allowance for U.S. Appl. No. 15/984,566, dated May 21, 2019, 6 pages.
Notice of Allowance for U.S. Appl. No. 16/150,556, dated Jul. 29, 2019, 7 pages.
Non-Final Office Action for U.S. Appl. No. 15/888,300, dated Jun. 27, 2019, 17 pages.
Final Office Action for U.S. Appl. No. 15/986,948, dated Aug. 27, 2019, 9 pages.
Advisory Action for U.S. Appl. No. 15/986,948, dated Nov. 8, 2019, 3 pages.
Notice of Allowance for U.S. Appl. No. 15/986,948, dated Dec. 13, 2019, 7 pages.
Final Office Action for U.S. Appl. No. 16/018,426, dated Sep. 4, 2019, 12 pages.
Advisory Action for U.S. Appl. No. 16/018,426, dated Nov. 19, 2019, 3 pages.
Notice of Allowance for U.S. Appl. No. 16/180,887, dated Jan. 13, 2020, 8 pages.
Notice of Allowance for U.S. Appl. No. 15/888,300, dated Jan. 14, 2020, 11 pages.
U.S. Appl. No. 16/354,234, filed Mar. 15, 2019.
U.S. Appl. No. 16/246,859, filed Jan. 14, 2019.
U.S. Appl. No. 16/180,887, filed Nov. 5, 2018.
U.S. Appl. No. 16/514,051, filed Jul. 17, 2019.
U.S. Appl. No. 16/435,940, filed Jun. 10, 2019.
Notice of Allowance for U.S. Appl. No. 16/155,127, dated Jun. 1, 2020, 8 pages.
Corrected Notice of Allowability for U.S. Appl. No. 15/888,300, dated May 13, 2020, 7 pages.
Non-Final Office Action for U.S. Appl. No. 16/246,859, dated Apr. 28, 2020, 9 pages.
Notice of Allowance for U.S. Appl. No. 16/354,234, dated Apr. 24, 2020, 9 pages.
Notice of Allowance for U.S. Appl. No. 16/122,611, dated Dec. 1, 2020, 9 pages.
Quayle Action for U.S. Appl. No. 16/589,940, dated Dec. 4, 2020, 8 pages.

(56) References Cited

OTHER PUBLICATIONS

Notice of Allowance for U.S. Appl. No. 16/122,611, dated Jan. 13, 2021, 8 pages.
Notice of Allowance for U.S. Appl. No. 16/284,023, dated Jan. 19, 2021, 7 pages.
Notice of Allowance for U.S. Appl. No. 16/416,812, dated Feb. 16, 2021, 8 pages.
Non-Final Office Action for U.S. Appl. No. 16/689,236 dated Mar. 2, 2021, 15 pages.
Notice of Allowance for U.S. Appl. No. 16/435,940, dated Dec. 21, 2020, 7 pages.
Notice of Allowance for U.S. Appl. No. 16/774,060, dated Feb. 3, 2021, 7 pages.
Notice of Allowance for U.S. Appl. No. 16/590,790, dated Jan. 27, 2021, 7 pages.
Notice of Allowance for U.S. Appl. No. 16/661,061, dated Feb. 10, 2021, 7 pages.
Notice of Allowance for U.S. Appl. No. 16/122,611, dated Apr. 1, 2021, 8 pages.
Notice of Allowance for U.S. Appl. No. 16/689,236 dated Jun. 9, 2021, 7 pages.
Non-Final Office Action for U.S. Appl. No. 16/775,554, dated Jun. 14, 2021, 5 pages.
Non-Final Office Action for U.S. Appl. No. 16/597,952, dated May 26, 2021, 7 pages.
Notice of Allowance for U.S. Appl. No. 16/834,049, dated Jun. 24, 2021, 8 pages.
Quayle Action for U.S. Appl. No. 16/855,154, dated Oct. 25, 2021, 6 pages.
Non-Final Office Action for U.S. Appl. No. 17/126,561, dated Oct. 14, 2021, 6 pages.
Notice of Allowance for U.S. Appl. No. 17/011,313, dated Nov. 4, 2021, 8 pages.
Non-Final Office Action for U.S. Appl. No. 16/597,952, dated Nov. 10, 2021, 9 pages.
Notice of Allowance for U.S. Appl. No. 17/115,982, dated Nov. 12, 2021, 8 pages.

* cited by examiner

DUAL-MODULATION POWER MANAGEMENT CIRCUIT

RELATED APPLICATIONS

This application claims the benefit of provisional patent application Ser. No. 62/828,214, filed Apr. 2, 2019, the disclosure of which is hereby incorporated herein by reference in its entirety.

FIELD OF THE DISCLOSURE

The technology of the disclosure relates to a power management circuit (PMC) in wireless communication devices, and more particularly to a dual-modulation PMC with a single charge-pump and a single power inductor.

BACKGROUND

Mobile communication devices have become increasingly common in current society for providing wireless communication services. The prevalence of these mobile communication devices is driven in part by the many functions that are now enabled on such devices. Increased processing capabilities in such devices means that mobile communication devices have evolved from being pure communication tools into sophisticated mobile multimedia centers that enable enhanced user experiences.

The redefined user experience requires higher data rate offered by wireless communication technologies. To achieve the higher data rate in mobile communication devices, sophisticated power amplifiers (PAs) may be employed in radio frequency (RF) front-end circuitry to increase output power of RF signals (e.g., maintaining sufficient energy per bit) communicated by mobile communication devices. However, the increased output power of RF signals can lead to increased power consumption and thermal dissipation in mobile communication devices, thus compromising overall performance and user experiences. As such, the mobile communication device may also employ average power tracking (APT) and/or envelope tracking (ET) power management technologies to help improve efficiency levels of PAs. In this regard, efficiency of the PMC may impact overall power consumption and performance of the mobile communication devices. In some applications, the PAs in the RF front-end circuitry may desire more than one modulated power supply to further improve the efficiency levels of PAs.

On the other hand, the PMC may also significantly affect the size of the RF front-end circuitry. Accordingly, there is also a need for an improved PMC design that provides dual/multiple modulated power supplies with a compact size.

SUMMARY

The present disclosure relates to a dual-modulation power management circuit (PMC) with a single charge-pump and a single power inductor. According to one embodiment, the disclosed dual-modulation PMC includes a first tracking amplifier coupled to a first voltage port, a second tracking amplifier coupled to a second voltage port, a multi-level voltage converter including a charge pump, and a low-dropout (LDO) switch unit coupled between the first voltage port and the second voltage port. The first tracking amplifier is configured to generate a first tracked voltage based on a first target voltage. A first modulated voltage at the first voltage port is related to the first tracked voltage. The second tracking amplifier is configured to generate a second tracked voltage based on a second target voltage. A second modulated voltage at the second voltage port is related to the second tracked voltage. The charge pump is configured to receive a battery voltage and generate a boosted voltage higher than the battery voltage. Herein, an output current based on the boosted voltage is induced toward the first voltage port. A first portion of the output current is eligible to flow through the LDO switch unit from the first voltage port to the second voltage port. The first modulated voltage at the first voltage port is not smaller than the second modulated voltage at the second voltage port over time.

According to another embodiment, the dual-modulation PMC further includes a power inductor coupled between the multi-level voltage converter and the first voltage port. Herein, the power inductor is configured to induce the output current based on the boosted voltage.

According to another embodiment, the dual-modulation PMC further includes a first control unit and a second control unit. Herein, the first control unit is configured to control the multi-level voltage converter to increase or decrease the output current towards the first voltage port. The second control unit is configured to control the LDO switch unit to increase or decrease the first portion of the output current from the first voltage port to the second voltage port.

In one embodiment of the dual-modulation PMC, the LDO switch unit is implemented by a transistor. Herein, a drain of the transistor is coupled to the first voltage port and a source of the transistor is coupled to the second voltage port. The second control unit is configured to control a gate of the transistor to increase or decrease the first portion of the output current from the first voltage port to the second voltage port.

In one embodiment of the dual-modulation PMC, the first control unit is one of a microprocessor, a microcontroller, a digital signal processor (DSP), and a field programmable gate array (FPGA). The second control unit is one of a microprocessor, a microcontroller, a DSP, and a FPGA.

In one embodiment of the dual-modulation PMC, the first tracking amplifier is coupled to the first voltage port via a first offset capacitor and the second tracking amplifier is coupled to the second voltage port via a second offset capacitor. The first modulated voltage at the first voltage port is equal to the first tracked voltage generated by the first tracking amplifier and a first offset voltage across the first offset capacitor. The second modulated voltage at the second voltage port is equal to the second tracked voltage generated by the second tracking amplifier and a second offset voltage across the second offset capacitor.

In one embodiment of the dual-modulation PMC, the first control unit is configured to control the charge pump by comparing the first tracked voltage from the first tracking amplifier and the first modulated voltage at the first voltage port. The second control unit is configured to control the LDO switch unit by comparing the second tracked voltage from the second tracking amplifier and the second modulated voltage at the second voltage port.

In one embodiment of the dual-modulation PMC, the multi-level voltage converter further includes a switch structure coupled between the charge pump and the power inductor. Herein, the first control unit is configured to control duty cycles of the charge pump in the multi-level voltage converter to change the value of the boosted voltage. The switch structure is controlled by the first control unit to selectively output the boosted voltage from the charge pump, the battery voltage, or zero voltage from ground to the power inductor, so as to control the output current towards the first voltage port.

In one embodiment of the dual-modulation PMC, the first modulated voltage and the second modulated voltage are eligible to be identical.

In one embodiment of the dual-modulation PMC, the first modulated voltage and the second modulated voltage are eligible to have at least one of an amplitude difference and a phase difference over time.

In one embodiment of the dual-modulation PMC, the first modulated voltage is eligible to be provided at the first voltage port, while the second modulated voltage is eligible to be turned off at the second voltage port.

According to another embodiment, the dual-modulation PMC further includes a signal split unit, which is configured to generate the first target voltage and the second target voltage based on one pulsed ramp signal. Herein, the first target voltage and the second target voltage are eligible to have at least one of an amplitude difference and a phase difference over time.

In one embodiment of the dual-modulation PMC, the boosted voltage is equal to two times the battery voltage.

In one embodiment of the dual-modulation PMC, the first tracking amplifier is configured to generate the first tracked voltage as a first envelope tracking (ET) voltage based on the first target voltage. The second tracking amplifier is configured to generate the second tracked voltage as a second ET voltage based on the second target voltage.

In one embodiment of the dual-modulation PMC, the first tracking amplifier is configured to generate the first tracked voltage as a first average power tracking (APT) voltage based on the first target voltage. The second tracking amplifier is configured to generate the second tracked voltage as a second APT voltage based on the second target voltage.

In one embodiment of the dual-modulation PMC, the first tracking amplifier receives a first supply voltage as a power supply, and the second tracking amplifier receives a second supply voltage as a power supply. Herein, the second supply voltage is not greater than the first supply voltage over time.

According to another embodiment, the dual-modulation PMC is included in a radio frequency (RF) front-end circuit. Besides the dual-modulation PMC, the RF front-end circuit also includes a Doherty amplifier coupled to the first voltage port and the second voltage port. Herein, the Doherty amplifier is configured to amplify an RF input signal based on both the first modulated voltage and the second modulated voltage. The Doherty amplifier includes a carrier amplifier and a peaking amplifier coupled in parallel. The carrier amplifier receives the first modulated voltage from the first voltage port as a power supply, while the peaking amplifier receives the second modulated voltage from the second voltage port as a power supply. The carrier amplifier handles the RF input signal up to an average power level, and the peaking amplifier operates once the carrier amplifier is saturated and handles the RF input signal from the average power level to a peak level.

According to another embodiment, the dual-modulation PMC further includes a signal split unit, which is configured to split one pulsed ramp signal into the first target voltage and the second target voltage based on operating functions of the carrier amplifier and the peaking amplifier, respectively. Herein, the pulsed ramp signal contains envelope information of the RF input signal applied to the Doherty amplifier. The first target voltage and the second target voltage are eligible to have at least one of an amplitude difference and a phase difference over time.

According to another embodiment, the dual-modulation PMC is included in an RF front-end circuit. Besides the dual-modulation PMC, the RF front-end circuit also includes a multi-stage amplifier configured to amplify an RF input signal based on both the first modulated voltage and the second modulated voltage and provide an RF output signal. Herein, the multi-stage amplifier includes a first stage amplifier and a second stage amplifier coupled in series, such that the first stage amplifier is configured to receive the RF input signal, and the second stage amplifier is configured to provide the RF output signal. The first stage amplifier is coupled to the second voltage port and receives the second modulated voltage as a power supply, while the second stage amplifier is coupled to the first voltage port and receives the first modulated voltage as a power supply.

According to another embodiment, the dual-modulation PMC further includes a signal split unit, which is configured to split one pulsed ramp signal into the first target voltage and the second target voltage based on operating functions of the first stage amplifier and the second stage amplifier, respectively. Herein, the pulsed ramp signal contains envelope information of the RF input signal applied to the multi-stage amplifier. The first target voltage and the second target voltage are eligible to have at least one of an amplitude difference and a phase difference over time.

According to another embodiment, the dual-modulation PMC is included in an RF front-end circuit. Besides the dual-modulation PMC, the RF front-end circuit also includes an amplification structure coupled to the first voltage port and the second voltage port. Herein, the amplification structure includes a first power amplifier and a second power amplifier coupled in parallel. The first power amplifier is configured to receive the first modulated voltage from the first voltage port as a power supply, and is eligible to amplify an RF input signal based on the first modulated voltage. The second power amplifier is configured to receive the second modulated voltage from the second voltage port as a power supply, and is eligible to amplify the RF input signal based on the second modulated voltage.

According to another embodiment, the dual-modulation PMC further includes a signal split unit, which is configured to split one pulsed ramp signal into the first target voltage and the second target voltage based on power level information of the first power amplifier and the second power amplifier, respectively. Herein, the pulsed ramp signal contains envelope information of the RF input signal applied to the amplification structure. The first target voltage and the second target voltage are eligible to be identical or have amplitude differences over time.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

Figure 1:
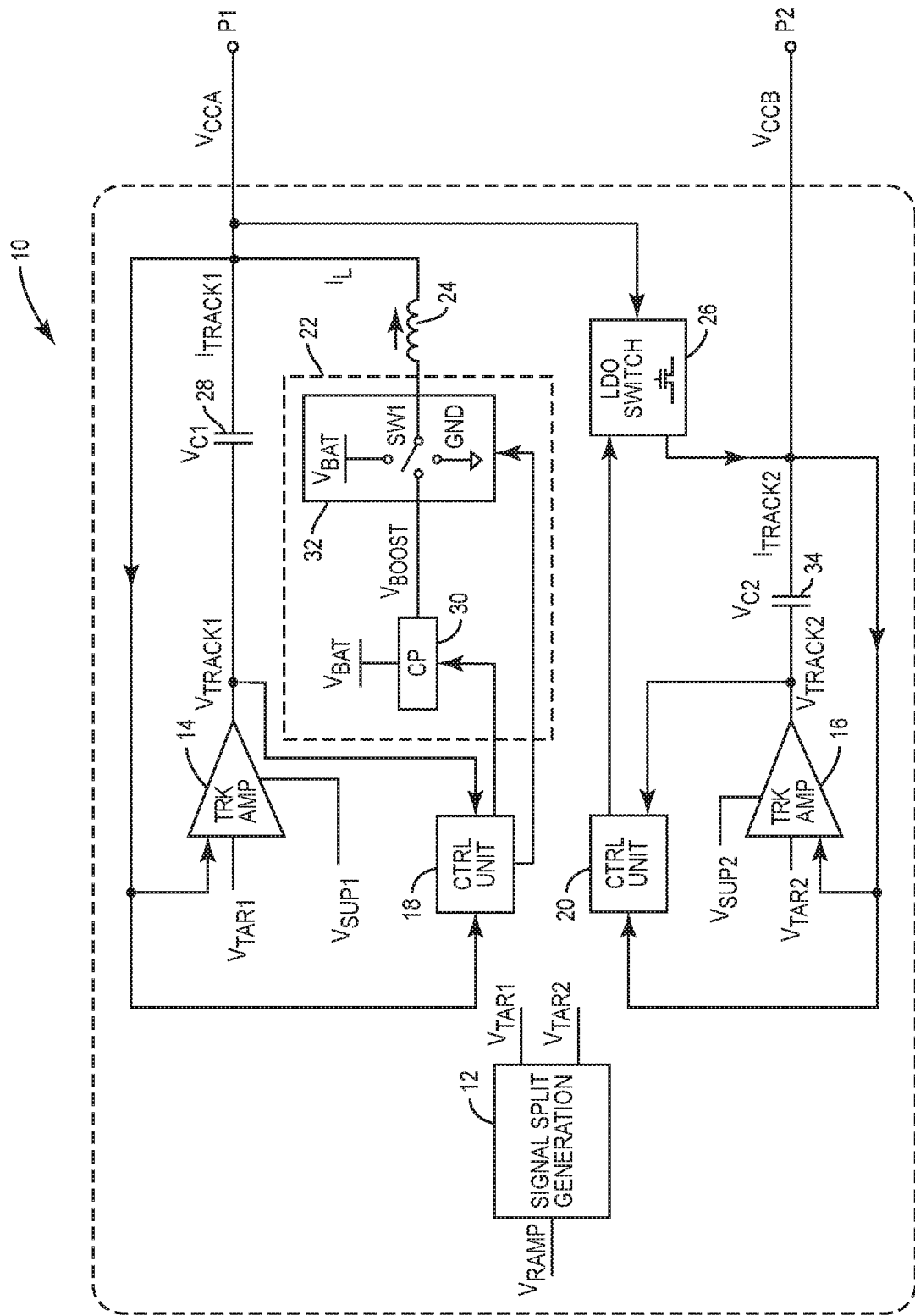
FIG. 1 illustrates an exemplary dual-modulation power management circuit (PMC) with a single charge-pump and a single power inductor according to an embodiment of the present disclosure.
Figure 2A:
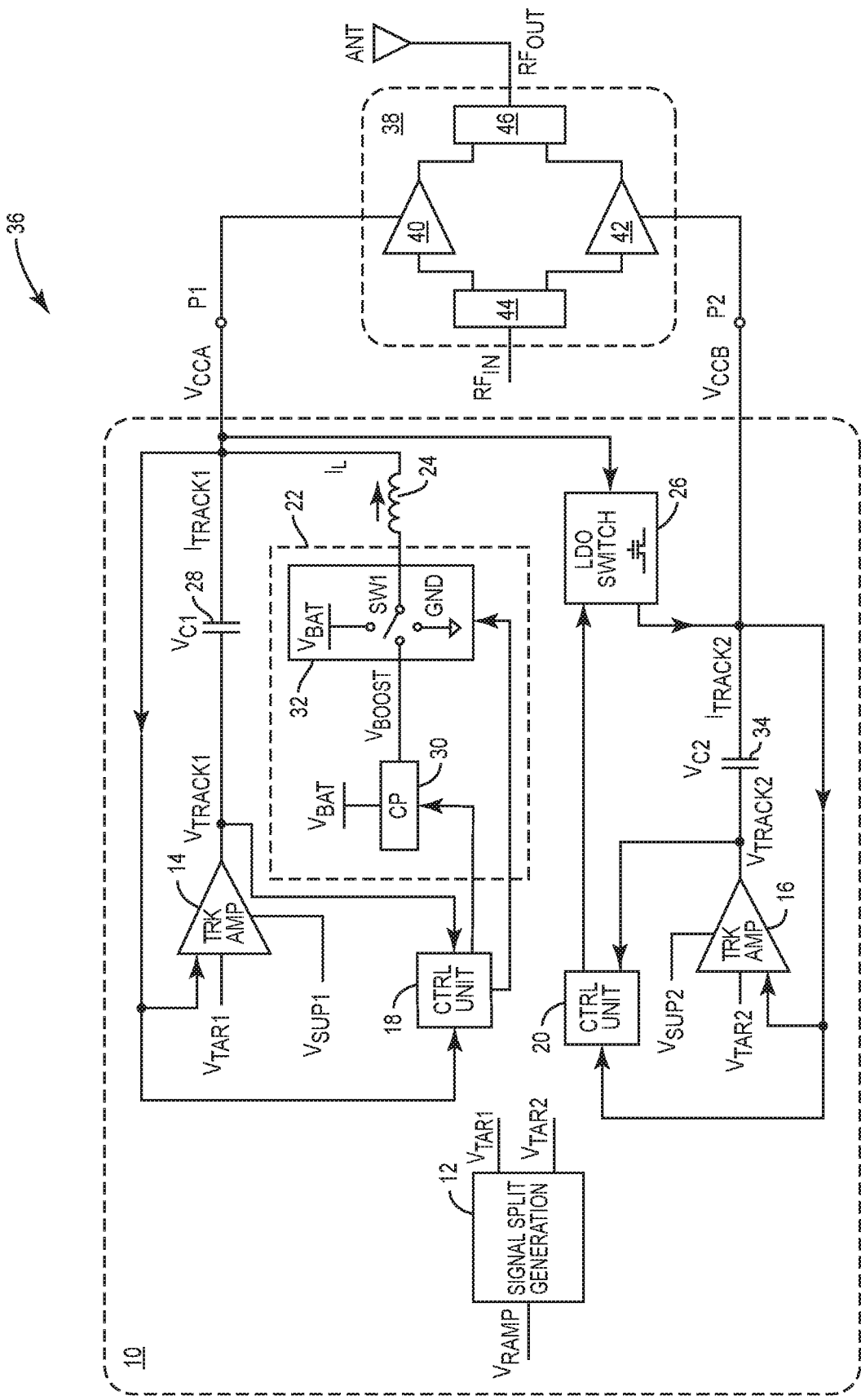
FIGS. 2A-2C illustrate an exemplary radio frequency (RF) front-end circuit with the dual-modulation PMC shown in FIG. 1.
Figure 2B:
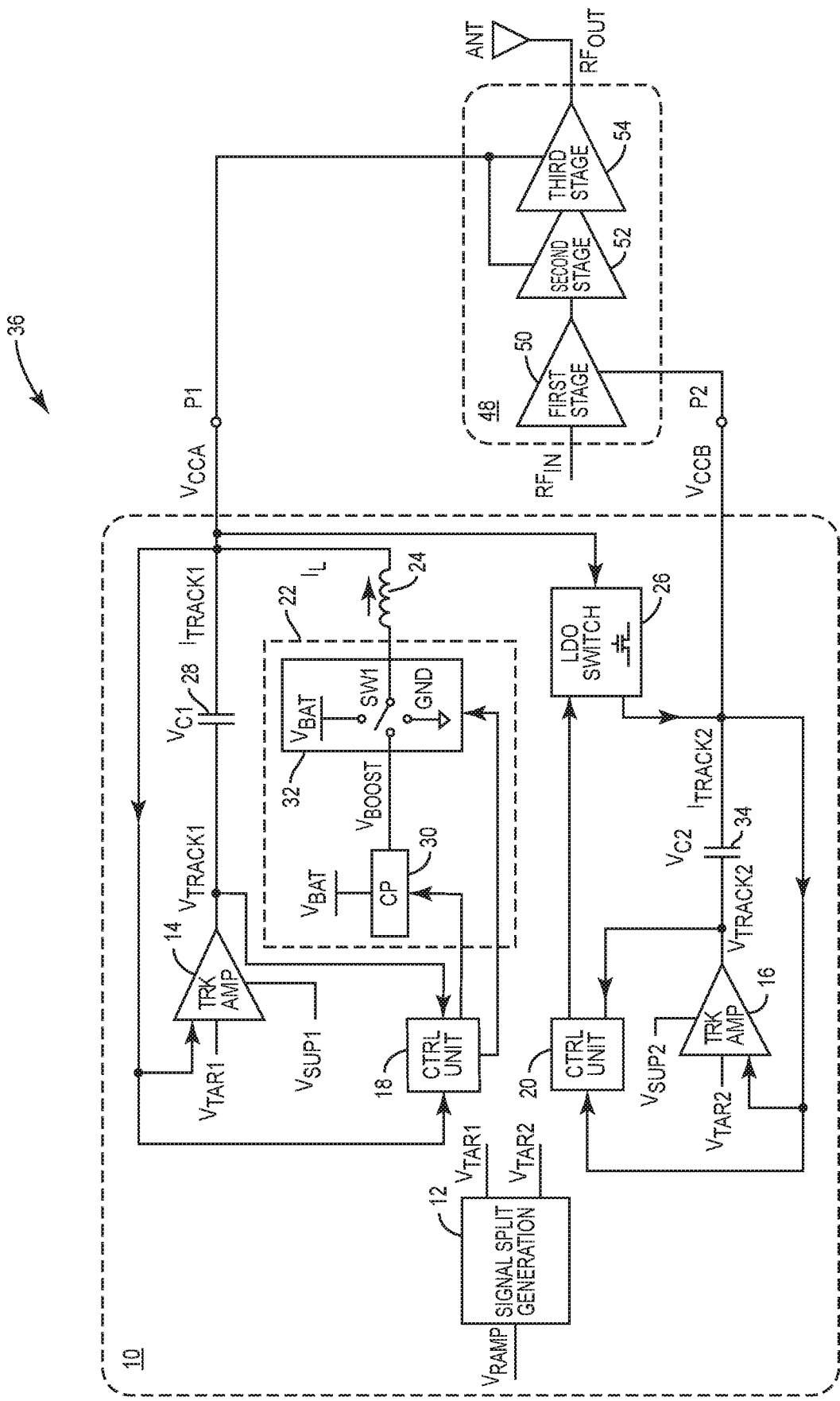
Figure 2C:
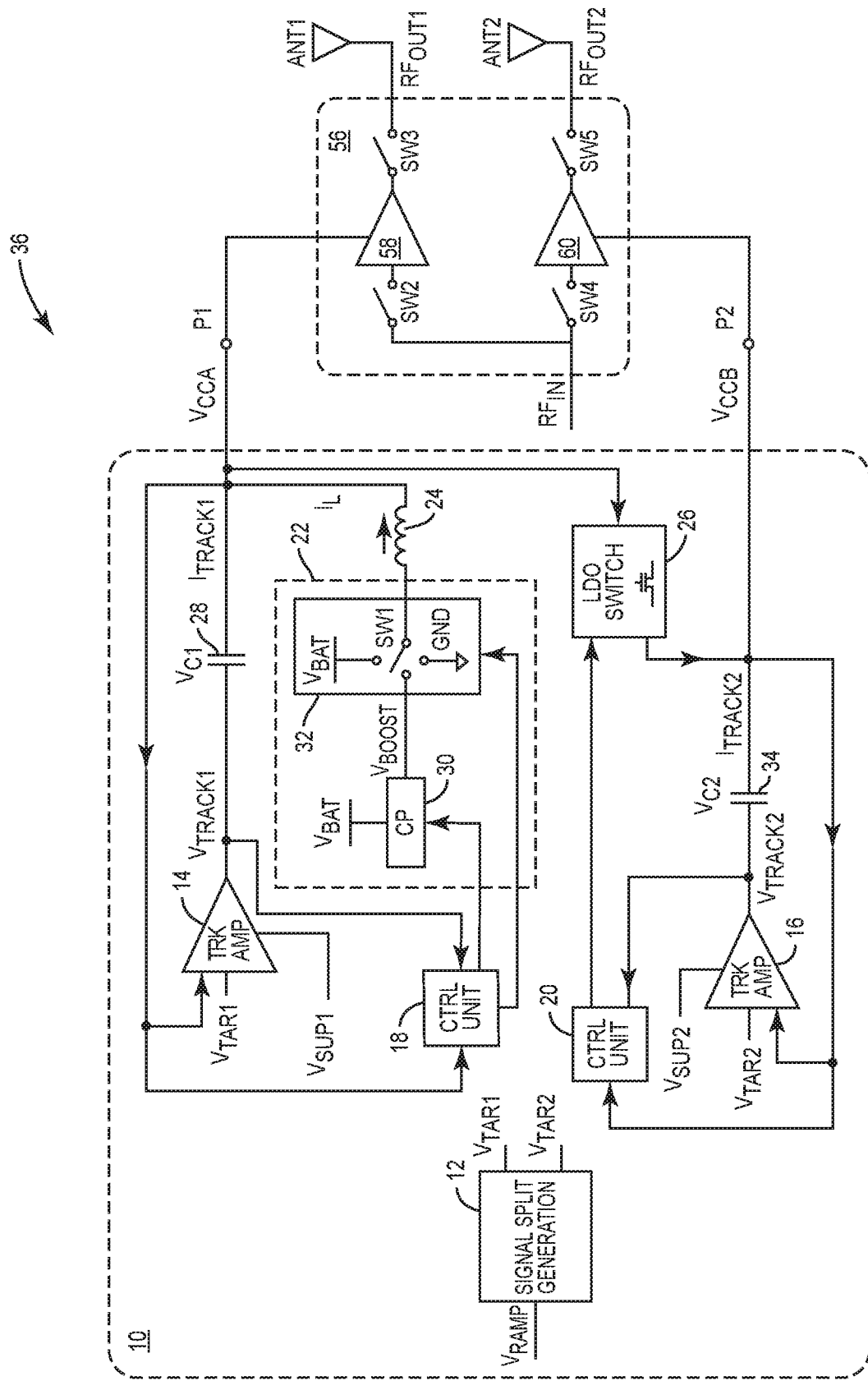

It will be understood that for clear illustrations, FIGS. 1-2C may not be drawn to scale.

DETAILED DESCRIPTION

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

The present disclosure relates to a dual-modulation power management circuit (PMC) in a radio frequency (RF) front-end circuit, where the dual-modulation PMC has a single charge-pump and a single power inductor. FIG. 1 shows an exemplary dual-modulation PMC 10, which is configured to provide a first modulated voltage $V_{CCA}$ and a second modulated voltage $V_{CCB}$ at a first voltage port P1 and a second voltage port P2, respectively, based on one pulsed ramp signal $V_{RAMP}$. The first modulated voltage $V_{CCA}$ and the second modulated voltage $V_{CCB}$ are voltage supplies to power amplifiers in an RF front-end circuit (more details are described later). Herein, the pulsed ramp signal $V_{RAMP}$ may be a differential signal, and varied with time. The pulsed ramp signal $V_{RAMP}$ contains voltage modulation information related to an RF input signal applied to the power amplifiers, such as envelope information of the RF input signal.

The dual-modulation PMC 10 includes a signal split unit 12, a first tracking amplifier 14, a second tracking amplifier 16, a first control unit 18, a second control unit 20, a multi-level voltage converter 22, a power inductor 24, and a low-dropout (LDO) switch unit 26. In detail, the signal split unit 12 is configured to receive the pulsed ramp signal $V_{RAMP}$ and provide a first target voltage $V_{TAR1}$ and a second target voltage $V_{TAR2}$ to the first tracking amplifier 14 and the second tracking amplifier 16 as input signals, respectively. Herein the first target voltage $V_{TAR1}$ and the second target voltage $V_{TAR2}$ may be single-end signals. In different applications (e.g. different types of power amplifiers used in the RF front-end circuit), the signal split unit 12 may be programmable, such that the first target voltage $V_{TAR1}$ and the second target voltage $V_{TAR2}$ may have amplitude differences and/or phase differences over time (more details are described later). In one example, the pulsed ramp signal $V_{RAMP}$ is a differential sine wave signal, the first target voltage $V_{TAR1}$ is a single-end version of the pulsed ramp signal $V_{RAMP}$ (ranging from 1 V-5 V), and the second target voltage $V_{TAR2}$ is a regulated version of the first target voltage $V_{TAR1}$ (ranging from 0.8 V-3 V). In another example, the second target voltage $V_{TAR2}$ has time delays compared to the first target voltage $V_{TAR1}$. In some applications, there may be only the first target voltage $V_{TAR1}$, but no second target voltage $V_{TAR2}$.

The first tracking amplifier 14 receives a first supply voltage $V_{SUP1}$ and is configured to provide a first tracked voltage $V_{TRACK1}$ based on the first target voltage $V_{TAR1}$. The first tracked voltage $V_{TRACK1}$ may be varied with time. In a non-limiting example, the first tracking amplifier 14 is coupled to the first voltage port P1 via a first offset capacitor 28, which is configured to provide a first offset voltage $V_{C1}$. The first offset voltage $V_{C1}$, which may be 1 V for example, may help raise the first tracked voltage $V_{TRACK1}$ to the first modulated voltage $V_{CCA}$ ($V_{CCA}=V_{TRACK1}+V_{C1}$) at the first voltage port P1, thus helping to lower the first supply voltage $V_{SUP1}$ required by the first tracking amplifier 14 to improve power efficiency in the dual-modulation PMC 10.

If the first tracking amplifier 14 is coupled directly to the first voltage port P1 without the first offset capacitor 28, then the first modulated voltage $V_{CCA}$ will be the same as the first tracked voltage $V_{TRACK1}$. In this regard, if the first modulated voltage $V_{CCA}$ at the first voltage port P1 is required to be 5 V for example, the first tracked voltage $V_{TRACK1}$ produced by the first tracking amplifier 14 will also be 5 V. Accordingly, the first supply voltage $V_{SUP1}$ needs to be at least 5 V. In contrast, if the first tracking amplifier 14 is coupled to the first voltage port P1 via the first offset capacitor 28 that provides the 1 V first offset voltage $V_{C1}$, then the first tracking amplifier 14 would only need to produce the first tracked voltage $V_{TRACK1}$ at 4 V. As a result, the first supply voltage $V_{SUP1}$ may be reduced to 4 V as well, thus helping improve power efficiency in the dual-modulation PMC 10. In one example, the first tracking amplifier 14 may be configured to generate the first tracked voltage $V_{TRACK1}$ as a first envelope tracking (ET) voltage based on the first target voltage $V_{TAR1}$. In another example, the first tracking amplifier 14 may be configured to generate the first tracked voltage $V_{TRACK1}$ as a first average power tracking (APT) voltage.

In addition, the first tracking amplifier 14 sources a first tracked current $I_{TRACK1}$ to the first voltage port P1 through the first offset capacitor 28. Since the first offset capacitor 28 may block direct current (DC) and/or low-frequency alternating current (AC), the first tracked current $I_{TRACK1}$ from the first tracking amplifier 14 to the first voltage port P1 may only include middle and/or high frequency AC portions. As such, the first tracking amplifier 14 may only provide middle and/or high frequency power energy to the first voltage port P1.

The first control unit 18 may be a microprocessor, a microcontroller, a digital signal processor (DSP), and a field programmable gate array (FPGA), for example. The multi-level voltage converter 22 includes a charge pump 30 and a switch structure 32. Herein, the charge pump 30 is configured to provide a boosted voltage $V_{BOOST}$ based on a battery voltage $V_{BAT}$, and the switch structure 32 is configured to selectively output the boosted voltage $V_{BOOST}$ from the charge pump 30, the battery voltage $V_{BAT}$, or zero voltage to the power inductor 24.

Comparing the first tracked voltage $V_{TRACK1}$ from the first tracking amplifier 14 and the first modulated voltage $V_{CCA}$ at the first voltage port P1 (representing that the first offset capacitor 28 needs to be charged or discharged), the first control unit 18 is configured to control duty cycles of the charge pump 30 to change the value of the boosted voltage $V_{BOOST}$. Typically, the boosted voltage $V_{BOOST}$ is higher than the battery voltage $V_{BAT}$. In a non-limiting example, the boosted voltage $V_{BOOST}$ may be equal to up to two times the battery voltage $V_{BAT}$ ($V_{BOOST}=2*V_{BAT}$).

The switch structure 32 is coupled between the charge pump 30 and the power inductor 24. In a non-limiting example, the switch structure 32 includes a single-pole three-throw (SP3T) switch, which is controlled (e.g., by the first control unit 18) to selectively connect to the charge pump 30, the battery voltage $V_{BAT}$, or ground. As such, the switch structure 32 selectively outputs the boosted voltage $V_{BOOST}$ from the charge pump 30, the battery voltage $V_{BAT}$, or zero voltage from ground to the power inductor 24. Notably, the switch structure 32 may be implemented by any number, type, and layout of switches without affecting functionalities of the switch structure 32.

The power inductor 24 is coupled between the switch structure 32 of the multi-level voltage converter 22 and the first voltage port P1. The voltage outputted by the switch structure 32 causes the power inductor 24 to induce an output current $I_L$ to the first voltage port P1. As such, the first control unit 18 is configured to control (e.g., increase/decrease) the output current $I_L$ to the first voltage port P1. Herein, since the power inductor 24 may block middle and/or high frequency AC, the output current $I_L$ from the power inductor 24 may only include DC and/or low frequency AC portions (e.g., lower frequency compared to the first tracked current $I_{TRACK1}$). Therefore, the multi-level voltage converter 22 and the power inductor 24 may only provide low frequency power energy to the first voltage port P1. In a non-limiting example, the power inductor 24 may have an inductance of 2.2 microHenry (μH).

Similarly, the second tracking amplifier 16 receives a second supply voltage $V_{SUP2}$ and is configured to provide a second tracked voltage $V_{TRACK2}$ based on the second target voltage $V_{TAR2}$. Herein, since the first target voltage $V_{TAR1}$ and the second target voltage $V_{TAR2}$ may have amplitude differences and/or phase differences, the first tracked voltage $V_{TRACK1}$ and the second tracked voltage $V_{TRACK2}$ based on the first target voltage $V_{TAR1}$ and the second target voltage $V_{TAR2}$, respectively, may have different shapes. In some applications, the second tracking amplifier 16 may be disabled, for example when there is no second target voltage $V_{TAR2}$ generated by the signal split unit 12.

In one embodiment, the second tracking amplifier 16 is coupled to the second voltage port P2 via a second offset capacitor 34, which is configured to provide a second offset voltage $V_{C2}$. The second offset voltage $V_{C2}$, which may be 1 V for example, may help raise the second tracked voltage $V_{TRACK2}$ to the second modulated voltage $V_{CCB}$ ($V_{CCB}=V_{TRACK2}+V_{C2}$) at the second voltage port P2, thus helping lower the second supply voltage $V_{SUP2}$ required by the second tracking amplifier 16 to improve power efficiency in the dual-modulation PMC 10.

If the second tracking amplifier 16 is coupled directly to the second voltage port P2 without the second offset capacitor 34, then the second modulated voltage $V_{CCB}$ will be the same as the second tracked voltage $V_{TRACK2}$. In this regard, if the second modulated voltage $V_{CCB}$ at the second voltage port P2 is required to be 3 V for example, the second tracked voltage $V_{TRACK2}$ produced by the second tracking amplifier 16 will also be 3 V. Accordingly, the second supply voltage $V_{SUP2}$ needs to be at least 3 V. In contrast, if the second tracking amplifier 16 is coupled to the second voltage port P2 via the second offset capacitor 34 that provides the 1 V second offset voltage $V_{C2}$, then the second tracking amplifier 16 would only need to produce the second tracked voltage $V_{TRACK2}$ at 2 V. As a result, the second supply voltage $V_{SUP2}$ may be reduced to 2 V as well, thus helping to improve power efficiency in the dual-modulation PMC 10.

In one example, the second tracking amplifier 16 may be configured to generate the second tracked voltage $V_{TRACK2}$ as a second ET voltage based on the second target voltage $V_{TAR2}$. In another example, the second tracking amplifier 16 may be configured to generate the second tracked voltage $V_{TRACK2}$ as a second APT voltage. In some applications, the first supply voltage $V_{SUP1}$ for the first tracking amplifier 14 and the second supply voltage $V_{SUP2}$ for the second tracking amplifier 16 may have the same or different values. In one embodiment, the first supply voltage $V_{SUP1}$ is not smaller than the second supply voltage $V_{SUP2}$ over time.

In addition, the second tracking amplifier 16 sources a second tracked current $I_{TRACK2}$ to the second voltage port P2 through the second offset capacitor 34. Since the second offset capacitor 34 may block DC and/or low-frequency AC, the second tracked current $I_{TRACK2}$ from the second tracking amplifier 16 to the second voltage port P2 may only include middle and/or high frequency AC portions. As such, the second tracking amplifier 16 may only provide middle and/or high frequency power energy to the second voltage port P2.

The second control unit 20 may be a microprocessor, a microcontroller, a DSP, and a FPGA, for example. The LDO switch unit 26 is coupled between the first voltage port P1 and the second voltage port P2. Comparing the second tracked voltage $V_{TRACK2}$ from the second tracking amplifier 16 with the second modulated voltage $V_{CCB}$ at the second voltage port P2 (representing that the first offset capacitor 28 needs to be charged or discharged), the second control unit 20 is configured to increase or decrease current through the LDO switch unit 26 from the first voltage port P1 to the second voltage port P2. In a non-limiting example, the LDO switch unit 26 may be implemented by a transistor. A drain of the transistor is coupled to the first voltage port P1 and a source of the transistor is coupled to the second voltage port P2. By controlling the gate of the transistor (the LDO switch 26), the second control unit 20 is configured to increase or decrease the current through from the first voltage port P1 to the second voltage port P2. In some applications, the LDO switch unit 26 may be disabled and there may be no current from the first voltage port P1 and the second voltage port P2.

Herein, the current through the LDO switch unit 26 from the first voltage port P1 and the second voltage port P2 is a first portion of the output current $I_L$. A second portion of the output current $I_L$ is provided at the first voltage port P1. As such, the multi-level voltage converter 22 and the power inductor 24 provide low frequency power energy to both the first voltage port P1 and the second voltage port P2 (through the LDO switch unit 26). Note that there is no extra multi-level voltage converter (charge pump) or extra power inductor included in the dual-modulation PMC 10. Typically, the area consumption of the LDO switch unit 26 is much smaller than the combination of the multi-level voltage converter 22 (charge pump) and the power inductor 24. Therefore, the overall size of the dual-modulation PMC 10 is smaller than a modulation PMC with dual multi-level voltage converters (charge pumps) and dual power inductors.

The dual-modulation PMC 10 may operate in three modes. In a first mode, the first modulated voltage $V_{CCA}$ and the second modulated voltage $V_{CCB}$ are provided at the first voltage port P1 and the second voltage port P2, respectively. Herein, the second modulated voltage $V_{CCB}$ is smaller than or equal to the first modulated voltage $V_{CCA}$ over time, so as to avoid reverse current flow in the LDO switch unit 26. Since the first tracked voltage $V_{TRACK1}$ and the second tracked voltage $V_{TRACK2}$ may have different shapes, the first modulated voltage $V_{CCA}$ and the second modulated voltage $V_{CCB}$, which are related to the first tracked voltage $V_{TRACK1}$ and the second tracked voltage $V_{TRACK2}$, respectively, may also have different shapes (amplitude and/or phase differences over time). In a second mode, the second modulated voltage $V_{CCB}$ and the first modulated voltage $V_{CCA}$ are identical. Herein, the second tracking amplifier 16 and the second control unit 20 may be disabled, and the LDO switch unit 26 is programmed as a closed switch (a transistor in saturation state). In a third mode, only the first modulated voltage $V_{CCA}$ is provided, while the second modulated voltage $V_{CCB}$ is turned off. Herein, the second tracking amplifier 16, the second control unit 20, and the LDO switch unit 26 may be disabled.

FIGS. 2A-2C illustrate an exemplary RF front-end circuit 36 with the dual-modulation PMC 10 shown in FIG. 1. In FIG. 2A, besides the dual-modulation PMC 10, the RF front-end circuit 36 also includes a Doherty amplifier 38, which is configured to receive an RF input signal $RF_{IN}$ and provide an amplified RF output signal $RF_{OUT}$ to an antenna ANT. The Doherty amplifier 38 is coupled to both the first voltage port P1 and the second voltage port P2, and receives the first modulated voltage $V_{CCA}$ and the second modulated voltage $V_{CCB}$ as power supplies.

In detail, the Doherty amplifier 38 includes a carrier amplifier 40, a peaking amplifier 42, a splitter 44, and a combiner 46. The splitter 44 enables the RF input signal $RF_{IN}$ to be directed to the carrier amplifier 40 and the peaking amplifier 42, and the combiner 46 enables the outputs from the carrier amplifier 40 and the peaking amplifier 42 to be summed to provide the composite amplified RF output signal $RF_{OUT}$. Herein, the carrier amplifier 40 is parallel with the peaking amplifier 42. The carrier amplifier 40 is always on and handles signals up to an average power level, and the peaking amplifier 42 is only on once the carrier amplifier 40 is saturated and handles signals from the average power level to a peak level. Therefore, power supplies requested by the carrier amplifier 40 and the peaking amplifier 42 may be different.

In one embodiment, the carrier amplifier 40 is coupled to the first voltage port P1 and configured to receive the first modulated voltage $V_{CCA}$ as a power supply. The peaking amplifier 42 is coupled to the second voltage port P2 and configured to receive the second modulated voltage $V_{CCB}$ as a power supply. Herein, the first modulated voltage $V_{CCA}$ applied to the carrier amplifier 40 is always on and ranges from a minimum voltage level $V_{CC\_MIN}$ to a saturation voltage level $V_{CCA\_SAT}$ (leading to the average power level), such as 1 V-5 V. When the first modulated voltage $V_{CCA}$ is smaller than the saturation voltage level $V_{CCA\_SAT}$, the peaking amplifier 42 does not operate and the second modulated voltage $V_{CCB}$ is turned off (the second tracking amplifier 16, the second control unit 20, and the LDO switch unit 26 in the dual-modulation PMC 10 may be disabled). Once the first modulated voltage $V_{CCA}$ reaches the saturation voltage level $V_{CCA\_SAT}$, the peaking amplifier 42 will kick-in and the second modulated voltage $V_{CCB}$ will start to be modulated, which may range from 0 V to a peak voltage level $V_{CCB\_P}$, such as between 0 V-3 V. When the first modulated voltage $V_{CCA}$ (applied to the carrier amplifier 40) reaches the saturation voltage level $V_{CCA\_SAT}$, and the second modulated voltage $V_{CCB}$ (applied to the peaking amplifier 42) reaches the peak voltage level $V_{CCB\_P}$, the Doherty amplifier 38 reaches the peak power level.

Note that when the peaking amplifier 42 operates, the first modulated voltage $V_{CCA}$ applied to the carrier amplifier 40 is always at the saturation voltage level $V_{CCA\_SAT}$. Further, the peak voltage level $V_{CCB\_P}$ for the peaking amplifier 42 is smaller than or equal to the saturation voltage level $V_{CCA\_SAT}$ for the carrier amplifier 40. Consequently, the first modulated voltage $V_{CCA}$ is always greater than or equal to the second modulated voltage $V_{CCB}$ over time, thus making it possible to utilize the dual-modulation PMC 10 with the single multi-level voltage converter 22 and the single power inductor 24.

In this embodiment, the pulsed ramp signal $V_{RAMP}$ applied to the signal split unit 12 in the dual-modulation PMC 10 may contain envelope information of the RF input signal $RF_{IN}$. The signal split unit 12 is configured to split the pulsed ramp signal $V_{RAMP}$ into the first target voltage $V_{TAR1}$ and the second target voltage $V_{TAR2}$ based on operating functions of the carrier amplifier 40 and the peaking amplifier 42, respectively. The first target voltage $V_{TAR1}$ and the second target voltage $V_{TAR2}$ may have amplitude differences and/or phase differences over time.

In high frequency applications, high power output is required to compensate for high propagation losses of signals at the high frequencies. As such, a multi-stage amplifier may be utilized to enhance signal power level. In FIG. 2B, besides the dual-modulation PMC 10, the RF front-end circuit 36 further includes a multi-stage amplifier 48, which is configured to receive the RF input signal $RF_{IN}$ and provide the amplified RF output signal $RF_{OUT}$ to the antenna ANT. The multi-stage amplifier 48 is coupled to both the first voltage port P1 and the second voltage port P2, and receives the first modulated voltage $V_{CCA}$ and the second modulated voltage $V_{CCB}$ as power supplies.

For the purpose of this illustration, the multi-stage amplifier 48 is a three-stage amplifier including a first stage amplifier 50, a second stage amplifier 52, and a third stage amplifier 54 coupled in series. In different applications, the multi-stage amplifier 48 may include fewer or more stage amplifiers. Herein, an amplified output provided by the first stage amplifier 50 is an input for the following second and third stage amplifiers 52, 54. As such, an input for the first stage amplifier 50 may have a lower power level than the input for the following second and third stage amplifiers 52, 54. The power supply requested by the second/third stage amplifier 52/54 may be greater than the power supply requested by the first stage amplifier 50. In addition, the input signal for the first stage amplifier 50 and the input signal for the following second and third stage amplifiers 52, 54 have time delays. To enhance power efficiency, it is desirable for the power supply to be aligned in time and amplitude with the input signal of a corresponding stage amplifier.

In one embodiment, the first stage amplifier 50 is coupled to the second voltage port P2 and configured to receive the second modulated voltage $V_{CCB}$ as a power supply. Both the second and third stage amplifiers 52, 54 are coupled to the first voltage port P1 and configured to receive the first modulated voltage $V_{CCA}$ as a power supply. Herein, the second modulated voltage $V_{CCB}$ applied to the first stage amplifier 50 may range between 0.8 V-3 V, while the first modulated voltage $V_{CCA}$ applied to the second and third stage amplifiers 52, 54 may range between 1 V-5 V. By providing separate modulated voltages $V_{CCA}$ and $V_{CCB}$ to different stage amplifiers in the multi-stage amplifier 48, the amplitude distortion and power efficiency of the multi-stage amplifier 48 may improve compared to the multi-stage amplifier 48 with a single power supply.

In addition, the first modulated voltage $V_{CCA}$ may have a time delay compared to the second modulated voltage $V_{CCB}$ to match corresponding inputs of the first stage amplifier 50 and the second/third stage amplifier 52/54, respectively. As such, the phase distortion and linearity of the multi-stage amplifier 48 may improve compared to the multi-stage amplifier 48 with a single power supply. Note that the first modulated voltage $V_{CCA}$ is always greater than or equal to the second modulated voltage $V_{CCB}$ over time, thus making it possible to utilize the dual-modulation PMC 10 with the single multi-level voltage converter 22 and the single power inductor 24.

In this embodiment, the pulsed ramp signal $V_{RAMP}$ applied to the signal split unit 12 in the dual-modulation PMC 10 may contains envelope information of the RF input signal $RF_{IN}$. The signal split unit 12 is configured to split the pulsed ramp signal $V_{RAMP}$ in to the first target voltage $V_{TAR1}$ and the second target voltage $V_{TAR2}$ based on the different operating functions in the multi-stage amplifier 48. The first target voltage $V_{TAR1}$ and the second target voltage $V_{TAR2}$ may have amplitude differences and/or phase differences over time.

In FIG. 2C, besides the dual-modulation PMC 10, the RF front-end circuit 36 further includes an amplification structure 56, which is configured to receive the RF input signal $RF_{IN}$ and provide one or more amplified RF output signals $RF_{OUT1}$ and/or $RF_{OUT2}$ to one or more antennas ANT1 and/or ANT2, respectively. The amplification structure 56 is coupled to both the first voltage port P1 and the second voltage port P2, and receives the first modulated voltage $V_{CCA}$ and the second modulated voltage $V_{CCB}$ as power supplies.

For the purpose of this illustration, the amplification structure 56 includes a first power amplifier 58, a second power amplifier 60, and four switches SW2-SW5. The first power amplifier 58 is coupled to the first voltage port P1 and receives the first modulated voltage $V_{CCA}$ as a power supply. The switches SW2 and SW3 enable the first power amplifier 58 to receive the RF input signal $RF_{IN}$ and transmit a first RF output signal $RF_{OUT1}$ to a first antenna ANT1. The second power amplifier 60 is coupled to the second voltage port P2 and receives the second modulated voltage $V_{CCB}$ as a power supply. The switches SW4 and SW5 enable the second power amplifier 60 to receive the RF input signal $RF_{IN}$ and transmit a second RF output signal $RF_{OUT2}$ to the second antenna ANT2. In different applications, the amplification structure 56 may include fewer or more switches without affecting functionalities of the amplification structure 56.

Herein, the first power amplifier 58 and the second power amplifier 60 may operate separately or simultaneously. The first power amplifier 58 and the second power amplifier 60 may amplify the same RF input signal $RF_{IN}$ with a same or different power level. As such, the first modulated voltage $V_{CCA}$ and the second modulated voltage $V_{CCB}$ may be identical or have amplitude differences over time. Note that the first modulated voltage $V_{CCA}$ is always equal to or greater than the second modulated voltage $V_{CCB}$ over time, thus making it possible to utilize the dual-modulation PMC 10 with the single multi-level voltage converter 22 and the single power inductor 24.

In this embodiment, the pulsed ramp signal $V_{RAMP}$ applied to the signal split unit 12 in the dual-modulation PMC 10 may contain envelope information of the common RF input signal $RF_{IN}$. The signal split unit 12 is configured to split the pulsed ramp signal $V_{RAMP}$ into the first target voltage $V_{TAR1}$ and the second target voltage $V_{TAR2}$ based on power level information of the first power amplifier 58 and the second power amplifier 60, respectively. The first target voltage $V_{TAR1}$ and the second target voltage $V_{TAR2}$ may be the same or different.

Those skilled in the art will recognize improvements and modifications to the preferred embodiments of the present disclosure. All such improvements and modifications are considered within the scope of the concepts disclosed herein and the claims that follow.

What is claimed is:
1. An apparatus comprising:
  a first tracking amplifier coupled to a first voltage port and configured to generate a first tracked voltage based on a first target voltage, wherein a first modulated voltage at the first voltage port is related to the first tracked voltage;
  a second tracking amplifier coupled to a second voltage port and configured to generate a second tracked voltage based on a second target voltage, wherein:

a second modulated voltage at the second voltage port is related to the second tracked voltage; and
the first modulated voltage at the first voltage port is not smaller than the second modulated voltage at the second voltage port over time;
a multi-level voltage converter comprising a charge pump that is configured to receive a battery voltage and generate a boosted voltage higher than the battery voltage, wherein an output current based on the boosted voltage is induced toward the first voltage port; and
a low-dropout (LDO) switch unit coupled between the first voltage port and the second voltage port, wherein the LDO switch unit is configured, such that:
a first portion of the output current is capable of flowing through the LDO switch unit from the first voltage port to the second voltage port.

2. The apparatus of claim 1 further comprising a power inductor coupled between the multi-level voltage converter and the first voltage port, wherein the power inductor is configured to induce the output current based on the boosted voltage.

3. The apparatus of claim 2 further comprising a first control unit and a second control unit, wherein:
the first control unit is configured to control the multi-level voltage converter to increase or decrease the output current flowing to the first voltage port; and
the second control unit is configured to control the LDO switch unit to increase or decrease the first portion of the output current from the first voltage port to the second voltage port.

4. The apparatus of claim 3 wherein the LDO switch unit is implemented by a transistor, wherein:
a drain of the transistor is coupled to the first voltage port;
a source of the transistor is coupled to the second voltage port; and
the second control unit is configured to control a gate of the transistor to increase or decrease the first portion of the output current from the first voltage port to the second voltage port.

5. The apparatus of claim 3 wherein:
the first control unit is one of a group consisting of a microprocessor, a microcontroller, a digital signal processor (DSP), and a field programmable gate array (FPGA); and
the second control unit is one of a group consisting of a microprocessor, a microcontroller, a DSP, and a FPGA.

6. The apparatus of claim 3 wherein:
the first tracking amplifier is coupled to the first voltage port via a first offset capacitor;
the second tracking amplifier is coupled to the second voltage port via a second offset capacitor;
the first modulated voltage at the first voltage port is equal to the first tracked voltage generated by the first tracking amplifier and a first offset voltage across the first offset capacitor; and
the second modulated voltage at the second voltage port is equal to the second tracked voltage generated by the second tracking amplifier and a second offset voltage across the second offset capacitor.

7. The apparatus of claim 6, wherein:
the first control unit is configured to control the charge pump by comparing the first tracked voltage from the first tracking amplifier and the first modulated voltage at the first voltage port; and
the second control unit is configured to control the LDO switch unit by comparing the second tracked voltage from the second tracking amplifier and the second modulated voltage at the second voltage port.

8. The apparatus of claim 3 wherein the multi-level voltage converter further comprises a switch structure coupled between the charge pump and the power inductor, wherein:
the first control unit is configured to control duty cycles of the charge pump in the multi-level voltage converter to change a value of the boosted voltage; and
the switch structure is controlled by the first control unit to selectively output the boosted voltage from the charge pump, the battery voltage, or zero voltage from ground to the power inductor, so as to control the output current flowing to the first voltage port.

9. The apparatus of claim 1, wherein the first modulated voltage and the second modulated voltage are identical.

10. The apparatus of claim 1, wherein the first modulated voltage and the second modulated voltage have at least one of an amplitude difference and a phase difference over time.

11. The apparatus of claim 1, wherein when the first modulated voltage provided at the first voltage port is smaller than a saturation voltage level, the second modulated voltage is turned off at the second voltage port.

12. The apparatus of claim 1 further comprising a signal split unit, which is configured to generate the first target voltage and the second target voltage based on one pulsed ramp signal, wherein the first target voltage and the second target voltage have at least one of an amplitude difference and a phase difference over time.

13. The apparatus of claim 1 wherein the boosted voltage is equal to two times the battery voltage.

14. The apparatus of claim 1 wherein:
the first tracking amplifier is configured to generate the first tracked voltage as a first envelope tracking (ET) voltage based on the first target voltage; and
the second tracking amplifier is configured to generate the second tracked voltage as a second ET voltage based on the second target voltage.

15. The apparatus of claim 1 wherein:
the first tracking amplifier is configured to generate the first tracked voltage as a first average power tracking (APT) voltage based on the first target voltage; and
the second tracking amplifier is configured to generate the second tracked voltage as a second APT voltage based on the second target voltage.

16. The apparatus of claim 1 wherein:
the first tracking amplifier receives a first supply voltage as a power supply;
the second tracking amplifier receives a second supply voltage as a power supply; and
the second supply voltage is not greater than the first supply voltage over time.

17. The apparatus of claim 1 further comprising a Doherty amplifier coupled to the first voltage port and the second voltage port, wherein:
the Doherty amplifier is configured to amplify a radio frequency (RF) input signal based on both the first modulated voltage and the second modulated voltage;
the Doherty amplifier includes a carrier amplifier and a peaking amplifier coupled in parallel, wherein the carrier amplifier receives the first modulated voltage from the first voltage port as a power supply, while the peaking amplifier receives the second modulated voltage from the second voltage port as a power supply;
the carrier amplifier handles the RF input signal up to an average power level; and the peaking amplifier operates once the carrier amplifier is saturated and handles the RF input signal from the average power level to a peak level.

18. The apparatus of claim 17 further comprising a signal split unit, which is configured to split one pulsed ramp signal into the first target voltage and the second target voltage based on operating functions of the carrier amplifier and the peaking amplifier, respectively, wherein:

the pulsed ramp signal contains envelope information of the RF input signal applied to the Doherty amplifier; and the first target voltage and the second target voltage have at least one of an amplitude difference and a phase difference over time.

19. The apparatus of claim 1 further comprising a multi-stage amplifier configured to amplify a radio frequency (RF) input signal based on both the first modulated voltage and the second modulated voltage and provide an RF output signal, wherein:

the multi-stage amplifier includes a first stage amplifier and a second stage amplifier coupled in series, such that the first stage amplifier is configured to receive the RF input signal, and the second stage amplifier is configured to provide the RF output signal; and the first stage amplifier is coupled to the second voltage port and receives the second modulated voltage as a power supply, while the second stage amplifier is coupled to the first voltage port and receives the first modulated voltage as a power supply.

20. The apparatus of claim 19 further comprising a signal split unit, which is configured to split one pulsed ramp signal into the first target voltage and the second target voltage based on operating functions of the first stage amplifier and the second stage amplifier, respectively, wherein:

the pulsed ramp signal contains envelope information of the RF input signal applied to the multi-stage amplifier; and the first target voltage and the second target voltage have at least one of an amplitude difference and a phase difference over time.

21. The apparatus of claim 1 further comprising an amplification structure coupled to the first voltage port and the second voltage port, wherein:

the amplification structure includes a first power amplifier and a second power amplifier coupled in parallel;

the first power amplifier is configured to receive the first modulated voltage from the first voltage port as a power supply, and configured to amplify a radio frequency (RF) input signal based on the first modulated voltage; and the second power amplifier is configured to receive the second modulated voltage from the second voltage port as a power supply, and configured to amplify the RF input signal based on the second modulated voltage.

22. The apparatus of claim 21 further comprising a signal split unit, which is configured to split one pulsed ramp signal into the first target voltage and the second target voltage based on power level information of the first power amplifier and the second power amplifier, respectively, wherein:

the pulsed ramp signal contains envelope information of the RF input signal applied to the amplification structure; and the first target voltage and the second target voltage are identical or have amplitude differences over time.

* * * * *